United States Patent
Hsu

(10) Patent No.: US 6,611,999 B1
(45) Date of Patent: Sep. 2, 2003

(54) DETENT MEANS FOR A HEAT SINK

(75) Inventor: Hsien-Keng Hsu, Tsu Tien (TW)

(73) Assignee: Glacialtech, Inc., Taipei (TW)

( * ) Notice: Subject to any disclaimer, the term of this patent is extended or adjusted under 35 U.S.C. 154(b) by 0 days.

(21) Appl. No.: 10/107,459

(22) Filed: Mar. 28, 2002

(51) Int. Cl.⁷ .............................................. H05K 7/20
(52) U.S. Cl. ...................... 24/457; 361/704; 174/16.3; 165/80.3; 24/458
(58) Field of Search .................. 24/458, 457; 361/704; 174/16.3; 165/80.3; 257/718

(56) References Cited

U.S. PATENT DOCUMENTS

| | | | | |
|---|---|---|---|---|
| 5,241,453 A | * | 8/1993 | Bright et al. ............... | 361/704 |
| 5,594,624 A | * | 1/1997 | Clemens et al. ............ | 361/704 |
| 6,226,186 B1 | * | 5/2001 | Chien ......................... | 361/704 |
| 6,343,015 B1 | * | 1/2002 | Huang et al. ............... | 361/704 |
| 6,381,813 B1 | * | 5/2002 | Lai ............................. | 24/456 |
| 6,449,817 B1 | * | 9/2002 | Hsu ............................ | 24/459 |

* cited by examiner

Primary Examiner—Robert J. Sandy
(74) Attorney, Agent, or Firm—Bacon & Thomas, PLLC

(57) ABSTRACT

The detent means for a heat sink is provided thereon with an elastic member in connecting with two side clamp holders, the elastic member is bent to render the bending area to be the force bearing point which is communicating in force with the two side clamp holders, the thickness of a lateral arm between the bending area and one of the two side clamp holders is gradually reduced toward the side clamp holder; the lateral arm of the elastic member can be slightly bent and fixed in shape by the force exerting on the elastic member, after being fixed in shape, the elastic variable thereof is fixed for firmly holding by clamping; the detent means can prevent cracking of the main body of the heat source due to an overly large clamping force, and can largely increase the extent of application of the detent means in mating with any of various main bodies of heat sources and heat sinks of different thickness.

7 Claims, 6 Drawing Sheets

DETENT MEANS FOR A HEAT SINK

BACKGROUND OF THE INVENTION

1. Field of the Invention

The present invention is related to a detent means for a heat sink, and especially to a detent means capable of being fixed in shape by bending to a suitable extent, the elastic variable thereof is fixed for firmly holding by clamping after being fixed in shape; the detent means can prevent cracking of the main body of the heat source due to an overly large clamping force, and can largely increase the extent of application of the detent means in mating with any of various main bodies of heat sources and heat sinks of different thickness.

2. Description of the Prior Art

Microprocessors (CPU's) used for personal computers nowadays shall be developed not only subject to the requirement of applications of Internet as well as multimedia etc., but also subject the requirement of the operation of the CPU's with high time pulses and high efficiency, in order to promote in the present markets. In such a tendency, it is certain that in designing for packaging the CPU's themselves, designers must pay attention to the capability of heat sinking. So that when in high speed operations of the CPU's, system damage or downing of a computer by uneasiness of effusion of the heat of high temperature can have no chance to be incurred.

As to the two main systems Intel and AMD in the CPU markets, among the techniques of packaging CPU's, the PGA packaging frame is considered as the principal one, a conventional PGA packaging frame has the advantages of easiness for heat sinking, relative easiness of elevating the manufacturing technique and relative low cost, thereby, they can take the place of the SECC packaging frame of Intel prevailing for quite a period of time. Presently, the CPU heat sinks mostly are developed taking the PGA packaging frame as their goal.

However, although the basic developing direction of the structures of CPU heat sinks is erected according to the packaging frames of CPU's, the difference of the amount of chips used in the CPU's developed respectively by the two main systems Intel and AMD and difference of the types of the central chips make quite differences among the appearance of the CPU's. Particularly, they are evidently different from one another in the thickness of the CPU's; the thickness of the CPU's of the AMD system is smaller presently. The thickness of the CPU's of the Intel system is about 1.5 mm larger than that of the AMD system, thereby, the detent means for a heat sink thereof not only shall have its elastic clamping force put in consideration when in designing whether it can be maintained at a proper value for elastic clamping, but also put in consideration that the elastic clamping force is influenced by the differences of thickness among the main bodies of heat sources (CPU's), in preventing cracking of the main bodies of heat sources with larger thickness by using the detent means with same clamping forces.

SUMMARY OF THE INVENTION

Thereby, the primary object of the present invention is that, the detent means for a heat sink of the present invention is provided on the detent means thereof with an elastic member in connecting with two side clamp holders, the elastic member is bent to render the bending area to be the force bearing point which is communicating in force with the two side clamp holders, the thickness of a lateral arm between the bending area and one of the two side clamp holders is gradually reduced toward the side clamp holder; the lateral arm of the elastic member can be slightly bent and fixed in shape by the force exerting on the elastic member, after being fixed in shape, the elastic variable thereof is fixed for firmly holding by clamping; the detent means can prevent cracking of the main body of the heat source due to an overly large clamping force, and can largely increase the extent of application of the detent means in mating with any of various main bodies of heat sources and heat sinks of different thickness.

Another object of the detent means for a heat sink of the present invention is that, at least two locking holes appropriately mutually separated are provided at each side clamp holder laterally of the elastic member of the detent means, thereby the clamping force of the detent means on the main body of the heat source can be divided.

Another object of the detent means for a heat sink of the present invention is that, the detent means is integrally formed of metallic material directly by punching molding, a pressing plate is provided and extended from one of the clamp holders to allow press contacting and pulling of a user. Therefore, when in final shaping, the pressing plate at the lower position originally is reversely folded to a position above the corresponding clamp holder, so that force exerted by the user can be transmitted to the elastic member, and can directly control the angular position of the clamp holder to thereby increase convenience in using.

The present invention will be apparent in its particular structure and effects after reading the detailed description of the preferred embodiments thereof in reference to the accompanying drawings.

DETAILED DESCRIPTION OF THE PREFERRED EMBODIMENT

Figure 1:
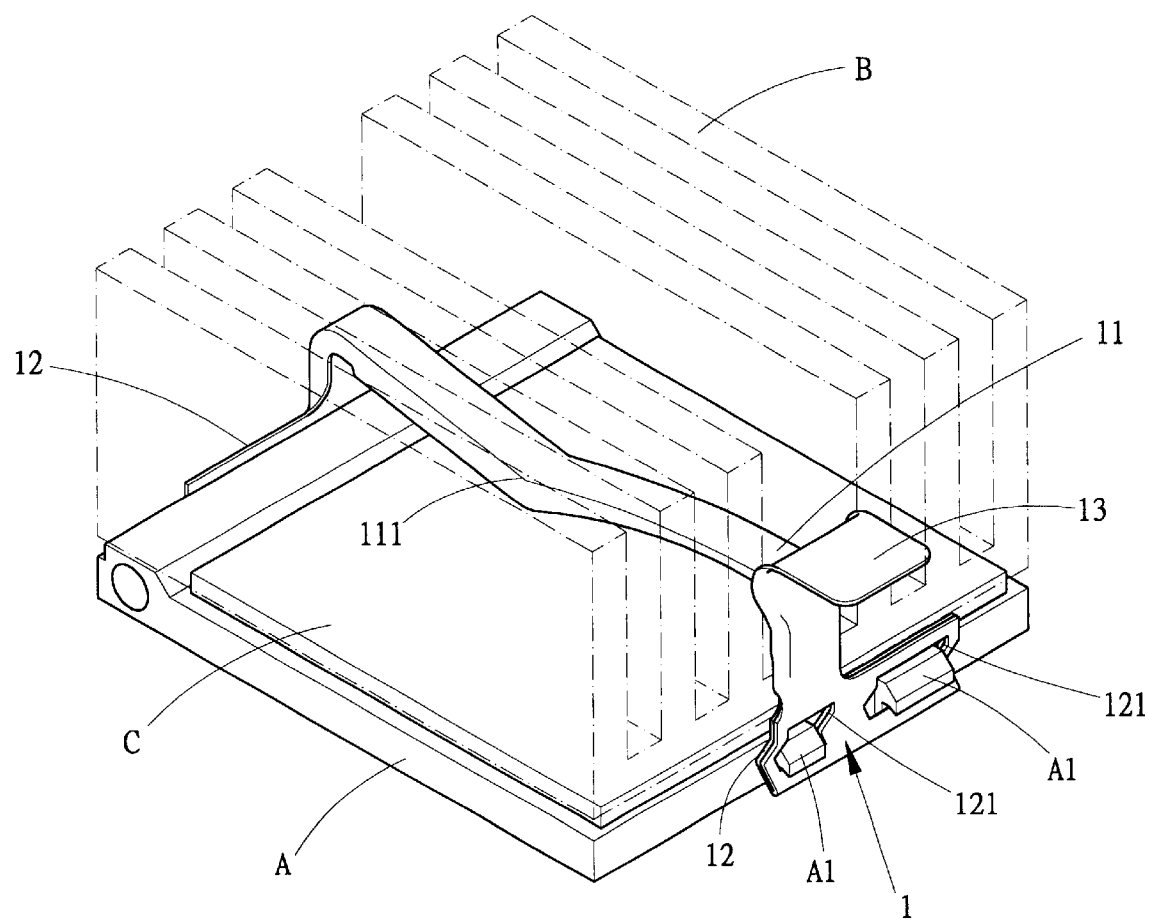
FIG. 1 is a schematic perspective view showing the clamping state of the detent means for a heat sink of the present invention on the main body of a heat source.
Figure 5:
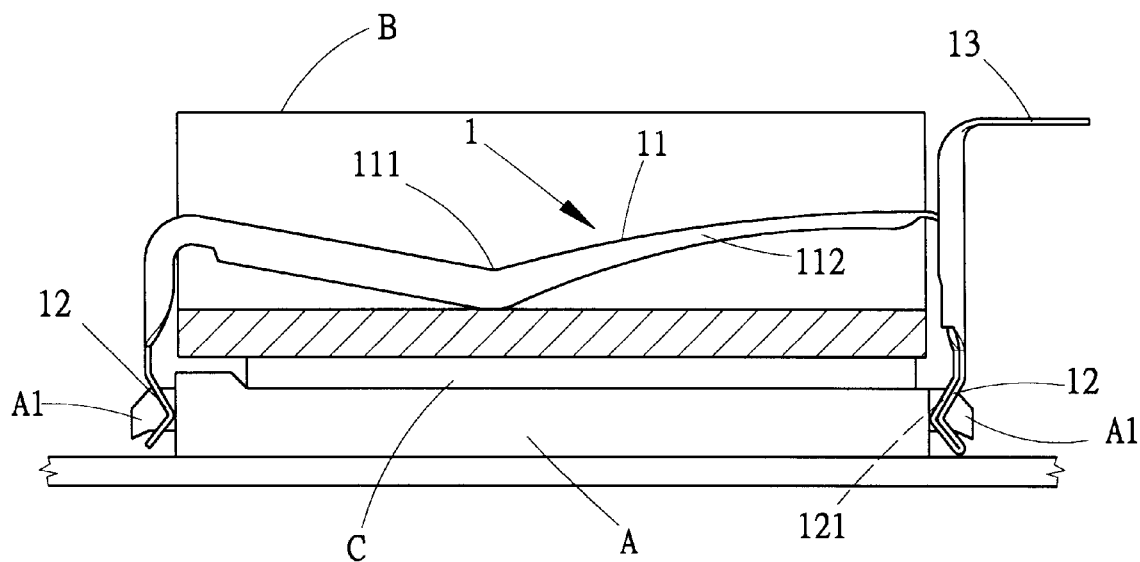
FIG. 5 is a schematic sectional view showing the locking state of the detent means for the heat sink of the present invention on the main body of a heat source.

Referring to FIG. 1, the detent means 1 of the present invention is used mainly to position a heat sink "B" on the main body of a heat source "C", in order that the heat in the main body of the heat source "C" can be diffused through the heat sink "B". In the embodiment shown in the drawing, the main body of the heat source "C" is a CPU inserted in a socket "A" of a PGA frame, the socket "A" is provided on the side for mounting the detent means 1 with a plurality of protruding engaging members A1. The detent means 1 has an elastic member 11 as the main portion thereof for pressing against the heat sink "B". Two clamp holders 12 are provided on the two lateral sides of the elastic member 11; the elastic member 11 is bent to render the bending area 111 to be the force bearing point which is communicating in force with the two side clamp holders. As shown in FIG. 5, the detent means 1 can thereby firmly position the heat sink "B" on the main body of the heat source "C" by its elastic force.

Figure 3:
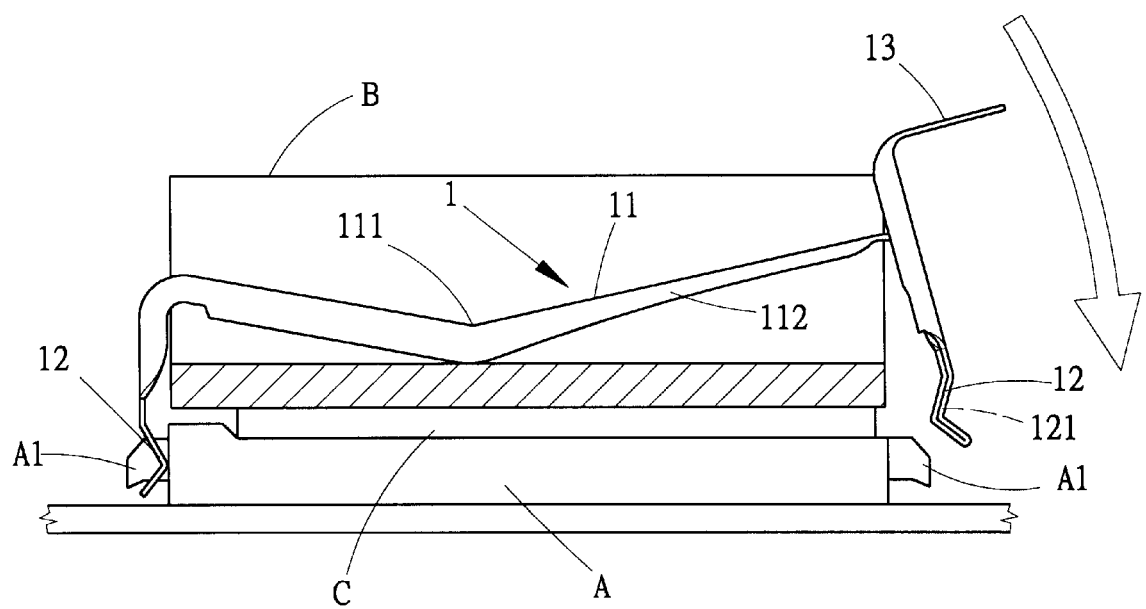
FIG. 3 is a schematic sectional view showing the primary pressing state of the detent means for the heat sink of the present invention on the main body of a heat source.
Figure 4:
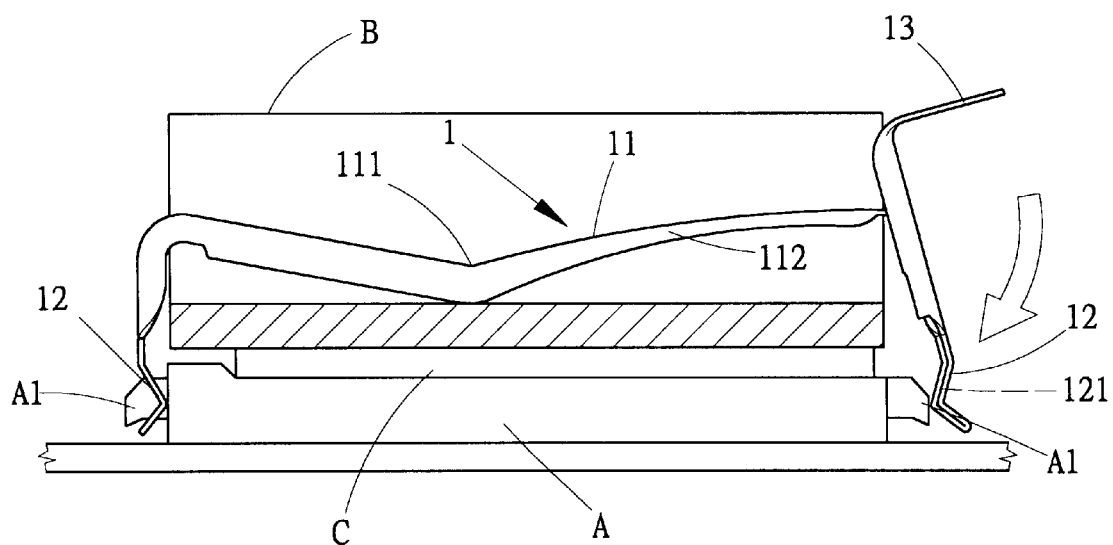
FIG. 4 is a schematic sectional view showing the bending shaping state of the elastic member of the detent means of the present invention.
Figure 6:
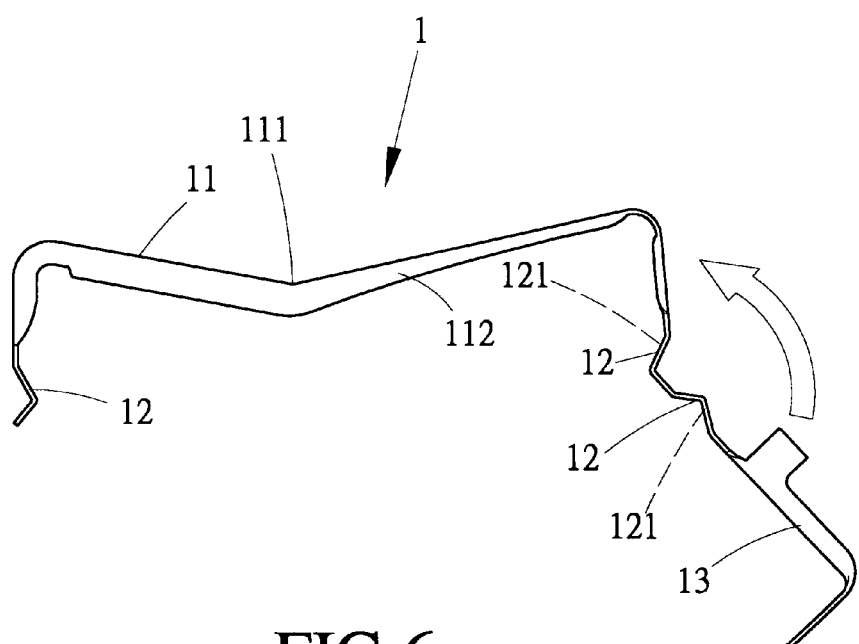
FIG. 6 is a schematic view showing the process of shaping of the detent means of the present invention.

Referring simultaneously to FIGS. 3 and 6, the detent means 1 including the elastic member 11 and the two clamp holders 12 provided on the two lateral sides of the elastic member 11 can be integrally formed of metallic material directly by punching molding. The main bodies of the clamp holders 12 are provided by punching with a plurality of locking holes 121 to engage with the protruding engaging members A1 on the socket "A". A pressing plate 13 is provided and extended from one of the clamp holders 12 to allow press contacting and pulling of a user. Therefore, when in final shaping, the pressing plate 13 at the lower position originally is reversely folded to a position above the corresponding clamp holder 12, so that force exerted by the user on the pressing plate 13 can be transmitted to the elastic member 11, and can directly control the angular position of the clamp holder 12 to thereby increase convenience in using when in clamping and positioning the heat sink "B" as is shown in FIG. 4.

Figure 2:
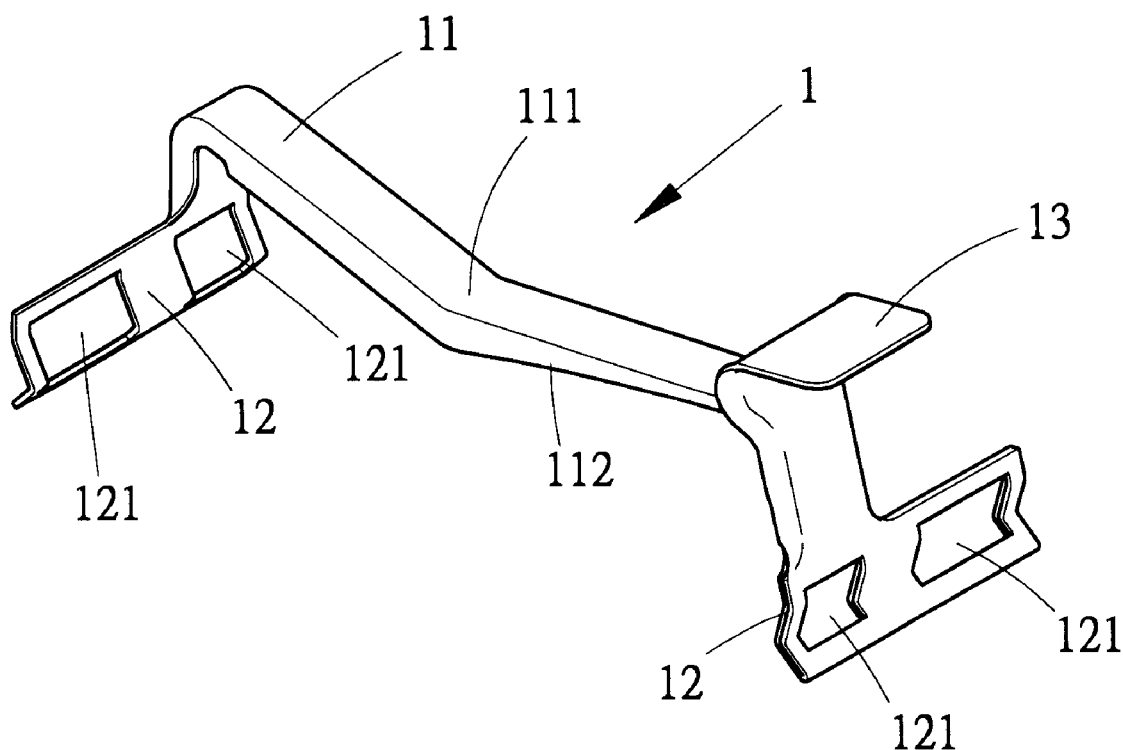
FIG. 2 is a perspective view of the detent means of the present invention.
Figure 7:
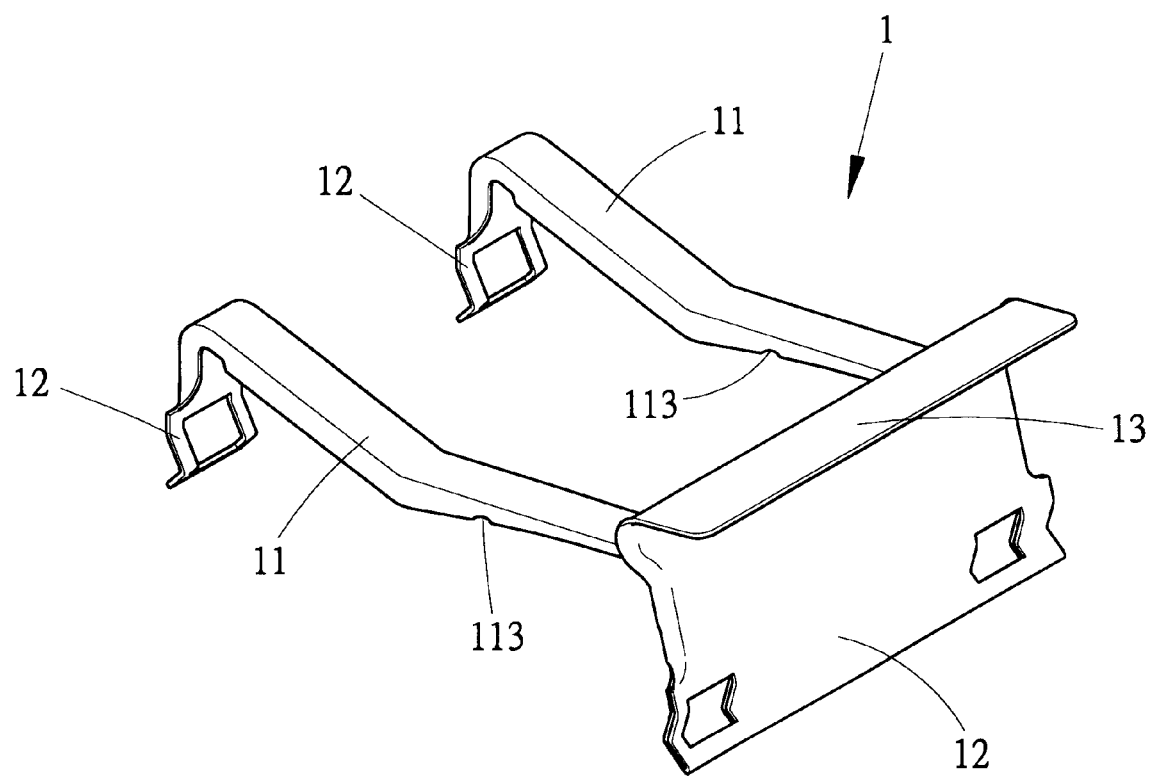
FIG. 7 is a perspective view of another embodiment of detent means of the present invention.
Figure 8:
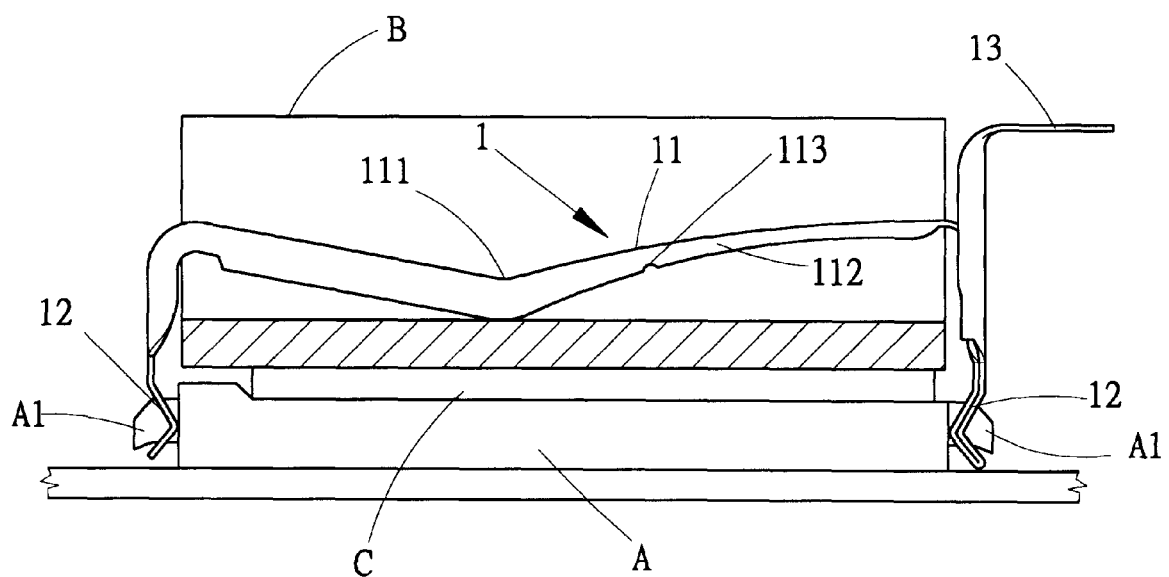
FIG. 8 is a sectional view showing another embodiment of detent means of the present invention with a recess provided on a lateral arm thereof.

As shown in FIGS. 1 and 2, the present invention is emphasized in designing an elastic member 11 so that the thickness of the lateral arm 112 between the bending area 111 and one of the two side clamp holders 12 is gradually reduced toward the side clamp holder 12; at least two locking holes 121 appropriately mutually separated are provided at each side clamp holder 12. As shown in FIG. 4, the elastic member 11 with the thickness of the lateral arm 112 thereof gradually reduced toward the side clamp holder 12 can be slightly bent and fixed in shape by the force exerting on the elastic member, after being fixed in shape, the elastic variable thereof is fixed for firmly holding by clamping; the detent means can prevent cracking of the main body of the heat source "C" due to an overly large clamping force, and can largely increase the extent of application of the detent means 1 in mating with any of various main bodies of heat sources "C" and heat sinks "A" of different thickness. Further as shown in FIG. 1, by virtue that at least two locking holes 121 appropriately mutually separated are provided at each side clamp holder 12 of the detent means 1, the detent means 1 or the body held by clamping by the detent means 1 can be prevented from destroying by avoiding concentration of stress of force by separating the action force between the detent means 1 and the body held by clamping. And as shown in FIG. 7, the main body of the entire detent means 1 can also be provided with a plurality of parallelly arranged elastic members 11 in meeting the real shape of a heat sink; and a plurality of clamp holders 12 are provided on both ends of the elastic members 11, so that the elastic members 11 can surely hold the heat sink by pressing. Further as shown in FIG. 8, the elastic member 11 have their respective lateral arms 112 provided each with a recess 113, when the elastic members 11 are under action of a force, they can be bent and fixed in shape by means of the recesses 113.

Having thus described my invention, what I claim as new and desire to be secured by Letters Patent of the United States are:

1. A detent means for positioning a heat sink on the main body of a heat source, comprising an elastic member as a main portion thereof for pressing against said heat sink, two clamp holders are provided on two lateral sides of said elastic member; said elastic member is bent to render a bending area to be a force bearing point which is communicating in force with said two side clamp holders, said detent means is characterized by that:

the thickness of a lateral arm between said bending area and one of said two side clamp holders is gradually reduced toward said side clamp holder; said lateral arm of said elastic member is slightly bent and fixed in shape by the force exerting on said elastic member, after being fixed in shape, an elastic force of said elastic member is fixed for firmly holding by clamping; said detent means prevents cracking of said main body of said heat source due to an overly large clamping force, and largely increases the extent of application of said detent means.

2. The detent means as in claim 1, wherein, a pressing plate is provided and extended from one of said clamp holders to allow press contacting and pulling of a user, so that force exerted by the user is transmitted to said elastic member, and directly controls the angular position of said clamp holders to thereby increase convenience in using.

3. The detent means as in claim 2, wherein, said detent means is integrally formed of metallic material by punching molding, thereby, said elastic member and said two clamp holders provided on the two lateral sides of said elastic member are integrally formed; when in final shaping, said pressing plate extended from one of said clamp holders at the lower position originally is reversely folded to a position above said clamp holder.

4. The detent means as in claim 1, wherein, said main body of said heat source is inserted in a socket, said socket is provided on a side of the main body for mounting said detent means with a plurality of protruding engaging members, said two clamp holders and said protruding engaging members of said socket provided on the two lateral sides of said elastic member are engaged mutually; said detent means thereby firmly positions said heat sink on said main body of said heat source by its elastic force.

5. The detent means as in claim 1, wherein, said main portion of said detent means is provided with a plurality of parallelly arranged elastic members for pressing against the heat sink; and a plurality of clamp holders are provided on both ends of said elastic members, so that said elastic members surely hold said heat sink by pressing.

6. The detent means as in claim 1, wherein, at least two locking holes appropriately mutually separated are provided at each of said side clamp holders laterally of said elastic member, thereby the clamping force of said detent means on said main body of said heat source is divided, and said detent means of the main body of the heat source held by clamping by said detent means is prevented from destroying.

7. The detent means as in claim 1, wherein, said lateral arm of said elastic member is provided with a recess.

* * * * *